United States Patent
Soyck

Patent Number: 5,811,893
Date of Patent: Sep. 22, 1998

[54] PROXIMITY SWITCH FOR OPERATION IN THE PRESENCE OF INTERFERENCE FIELDS

[75] Inventor: Gerno Soyck, Halver, Germany

[73] Assignee: Soyck GmbH, Schalksmühle, Germany

[21] Appl. No.: 693,157

[22] PCT Filed: Apr. 23, 1996

[86] PCT No.: PCT/EP96/01686

§ 371 Date: Aug. 5, 1996

§ 102(e) Date: Aug. 5, 1996

[87] PCT Pub. No.: WO97/01222

PCT Pub. Date: Jan. 9, 1994

[30] Foreign Application Priority Data

Jun. 22, 1995 [DE] Germany ......... 195 22 668.2

[51] Int. Cl.$^6$ ..................... H01H 35/00
[52] U.S. Cl. .............. 307/116; 307/91; 324/207.12; 324/207.15
[58] Field of Search ............. 307/91, 112, 116, 307/117, 125; 361/179, 180; 324/207.12, 207.15, 207.13, 207.14, 207.23

[56] References Cited

U.S. PATENT DOCUMENTS

| | | | |
|---|---|---|---|
| 4,583,006 | 4/1986 | Okada et al. | 307/116 |
| 4,673,827 | 6/1987 | Sommer | 307/116 |
| 4,719,362 | 1/1988 | Nest et al. | 307/116 |
| 4,757,213 | 7/1988 | Tigges et al. | 307/116 |
| 4,841,163 | 6/1989 | Mueller | 307/116 |
| 4,893,027 | 1/1990 | Kammerer et al. | 307/116 |
| 5,264,733 | 11/1993 | Tigges | 307/116 |
| 5,517,112 | 5/1996 | Vig et al. | 324/251 |
| 5,548,094 | 8/1996 | Tigges | 200/303 |

FOREIGN PATENT DOCUMENTS

| | | |
|---|---|---|
| 179384 | 4/1986 | European Pat. Off. . |
| 279268 | 8/1988 | European Pat. Off. . |
| 360263 | 3/1990 | European Pat. Off. . |
| 4003426 | 5/1991 | Germany . |

*Primary Examiner*—Jeffrey A. Gaffin
*Assistant Examiner*—Jonathan Kaplan
*Attorney, Agent, or Firm*—Collard & Roe, P.C.

[57] ABSTRACT

In order to make the commonly used approximation switch insensitive to intermittently occurring magnetic interference fields, such switch consisting of a magnetic field sensor (1) acting via an amplifier stage (2) on a switching stage (3), provision is made for a second sensor (4) reacting to such interference fields, said sensor, in its activated state, returning the given output signal of the switching stage (3) to the input of the amplifier stage (2) for maintaining the given lead signal of the sensor stage (magnetic field sensor 1), and thus preserving the functional state of the approximation switch present in the event of interference.

15 Claims, 2 Drawing Sheets

PROXIMITY SWITCH FOR OPERATION IN THE PRESENCE OF INTERFERENCE FIELDS

The invention relates to a magnetic field-actuated approximation or proximity switch, as it is used in many technical fields for the contactless initiation and execution of electrical switching, controlling and regulating processes.

THE PRIOR ART

The design and function of such an approximation switch are described, for example in DE 40 03 426 A1. According to the latter, the HF oscillating circuit serving as the sensor, such circuit being predamped by means of an amorphous metal body with high permeability due to eddy current losses, is deattenuated by the magnetic field of an approximating tripping device, and said process is used for controlling a switching device downstream.

In this connection, the sensor of the approximation switch, which is to be actuated in a defined way by a variable magnetic field, is susceptible to interference to a particularly high degree by any foreign magnetic field within its closer environment. Such interference fields occur, for example due to high current intensities particularly in connection with electric welding installations, where the sensors present there for controlling the equipment of the installation may be put out of operation by such interference fields.

Therefore, the invention is based on the problem of securing an approximation switch of the generic type specified above against being influenced by magnetic interference fields, which occur in the process of an operation in varied ways and at intervals.

BACKGROUND OF THE INVENTION

For solving said problem in connection with a magnetic field-actuated approximation switch provision is made according to the invention for a second sensor, which reacts to intermittently occurring magnetic interference fields, and which, in its activated state, returns the instantaneously present output signal of the switching stage to the input of the amplifier stage for maintaining the lead signal transmitted by the magnetic field sensor determining the function.

Accordingly, the interference field to be neutralized is not always present, but acting on an approximation switch only intermittently, such switch being actuated or not actuated at the given time. In this connection, by returning the corresponding output signal of the switching stage to the input of the amplifier stage according to the invention, a superposition of said output signal with the lead signal from the side of the magnetic field sensor takes place in the sense of a "preservation" of the latter signal, and at the same time a stabilization of the overall function of the approximation switch. Furthermore, an approximation switch so secured, when used in electric welding installations, is independent of the type and control of welding current used.

Useful embodiments and advantageous further developments of the invention are contained in the dependent claims and their features can be understood by the expert in the field without additional explanations.

BRIEF DESCRIPTION OF THE DRAWINGS

Referring to the drawings, wherein similar reference characters denote similar elements in the two views.

DESCRIPTION OF PREFERRED EMBODIMENT

Figure 1:
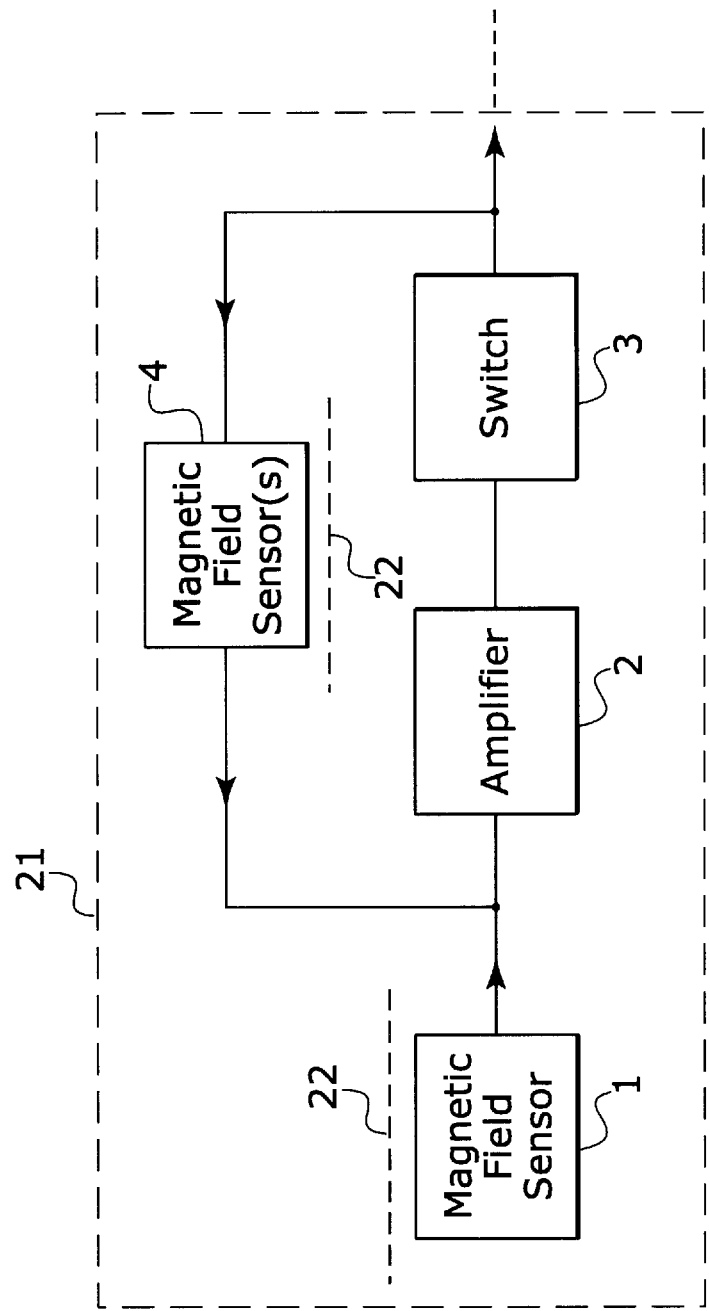
FIG. 1 is a simplified schematic diagram representing an embodiment of the invention; and, FIG. 2 is a detailed electrical block diagram of the circuit of the invention.

As shown by the block diagram according to FIG. 1, the lead signal transmitted by the magnetic field sensor 1 in dependence of a tripping magnetic field provided for such transmission, is supplied via an amplifier stage 2 to a transistorized switching stage 3, and converted by the latter into a defined output signal. In the event of interference, the output potential of the switching stage 3 is subsequently returned to the input of the amplifier stage 2 by means of a second sensor 4, the latter reacting to an intermittently occurring foreign magnetic field as it occurs, for example in electric welding installations, in order to preserve by superpositioning the lead signal fed in by the magnetic field sensor 1, and to make the approximation switch in its given switching state uninfluenced by the interference field as long as the latter is present.

In said arrangement, the magnetic field sensor 1 and the interference field sensor 4 are, by way of example, inductive sensors; however, it is possible also to use instead Hall sensors, magneto-resistive sensors, or even simple protective tube contacts, whereby the design and expenditure are determined by the given monitoring problem and the interference possibilities that have to be taken into account.

It is important for the flawless operation of the circuit arrangement that the response sensitivity of an interference field sensor 4 is greater and its reactivity (switching time) is lower than the corresponding properties or values of the magnetic field sensor 1. Accordingly, the amplifier stage 2, too, may be equipped versus the reaction of the interference field sensor 4 with a signal delay in the direction of switching stage 3. Furthermore, a plurality of interference field sensors 4 may be associated with one magnetic field sensor 1 within the same housing, and may be magnetically screened against each other, if need be.

Figure 2:
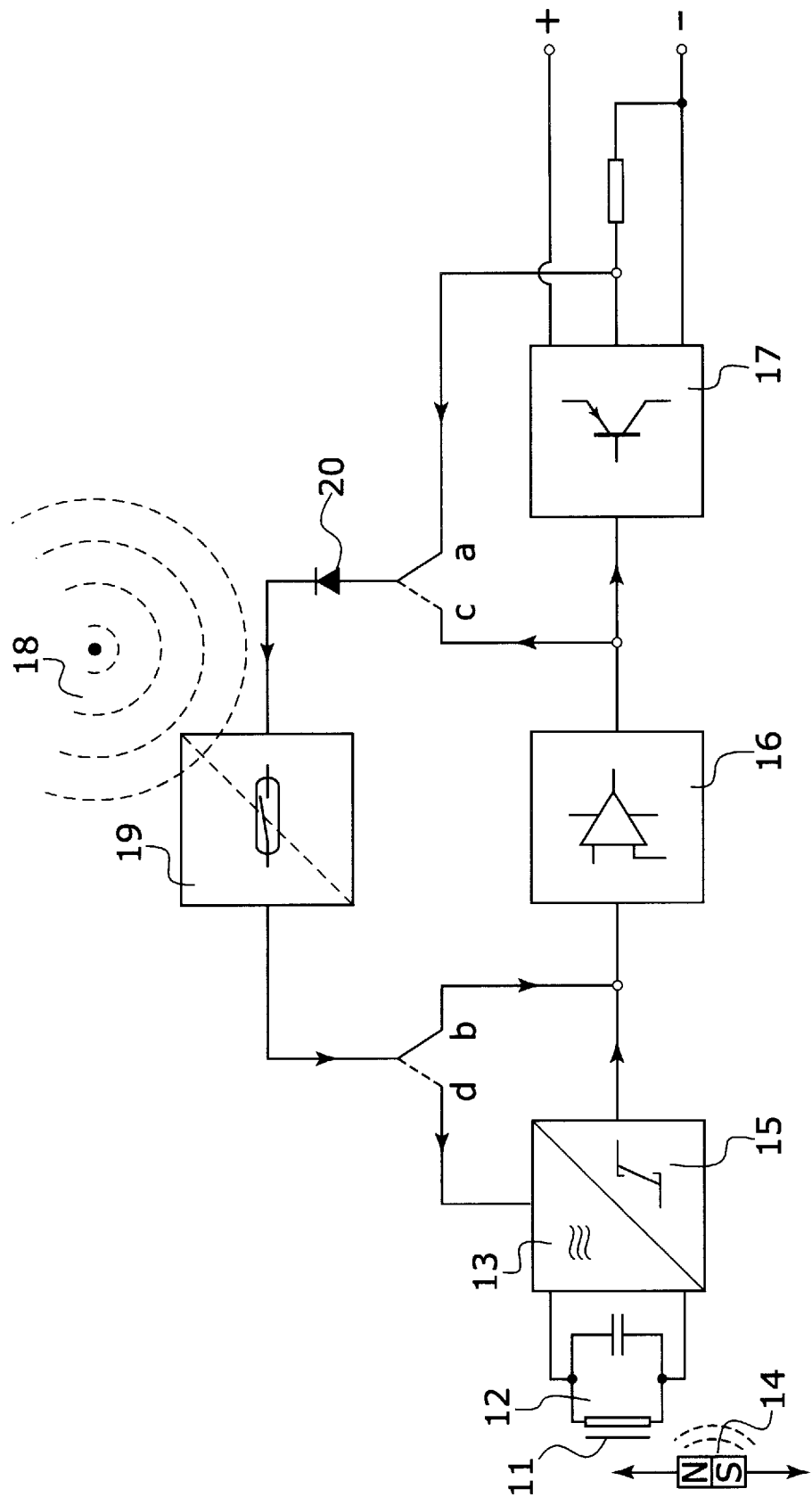

Advantageous variations of said design are shown by the expanded block circuit diagram according to FIG. 2 of the drawing.

Accordingly, the HF oscillating circuit 12 of an oscillator circuit 13 serving as the sensor element of the approximation switch, said oscillating circuit being predamped on its active surface by a highly permeable amorphous metal strip 11, is deattenuated by the (permanent) magnetic field of a tripping device 14 approximating in a defined way, and damped again when the latter is removed.

Said process is connected with a constant or intermittent change in the oscillator current, whereby the change between the predamped and the deattenuated state is converted into a binary lead signal (15), which is received as such a signal at the high-ohmic input of the amplifier stage 16 downstream, and from there by the switching stage 17. If, then, the sensor 19 preferably having the form of reed contact switch, said sensor reacting to the magnetic interference fields 18, is connected with the points a and b in the circuit in a fixed way, the low-ohmic output signal of the switching stage 17 from the present signal processing (16+17) is superimposed with coincidence in pole or phase on the lead signal from the side of the sensor elements 11 to 13. On the other hand, if the interference field sensor 19 is connected on the one side with point c instead of point a, an intermediate signal transmitted by the amplifier stage 16 can already be used for feeding back a positive or negative potential—depending on the damping state of sensor stages 11 to 15—to the input of the amplifier stage 16. Such a measure is advantageous if self-protective switching elements are used on the output side, which block the switching stage 17, for example in the event of overload or short-circuit. Furthermore, it is possible, if need be, to retransmit only one of the two potentials, for which purpose it is necessary only to interconnect in the switching route of the interference field sensor 19 a correspondingly poled blocking diode 20.

Moreover, the signal received from the signal processing can be applied by the interference field sensor 19 instead via point b to the input of amplifier stage 16 already via point d to a determining potential within the sensor stages 11 to 15, in order to obtain the same effect.

In any case, the return according to the invention assures that the given output state of the approximation switch is maintained constant as long as a magnetic interference field acts from somewhere on its sensing range, endangering its function. Said design of an approximation switch protects to this extent not only its function but at the same time also the correct operational process within an installation or plant.

What is claimed is:

1. An interference field proof proximity switch for detecting the presence of a magnetic field in the presence of intermittent interference fields comprising:

a first magnetic field sensor for sensing the presence of the magnetic field and providing an input signal in response to that field, an amplifier coupled to said first magnetic field sensor for amplifying said input signal, said amplifier having an input and an output;

switch means coupled to the output of said amplifier, said switch means having an output;

at least one second magnetic field sensor having an input coupled to the output of said switch means and having an output coupled to the input of said amplifier for sensing the presence of magnetic interference fields and providing a feedback signal in response to said interference field so that when an interference field is sensed, said feedback signal maintains said input signal sensed by said first magnetic field at a constant level until the magnetic interference field is diminished.

2. The proximity switch recited in claim 1, wherein said feedback signal is a positive or negative potential depending upon the state of damping of said first magnetic field sensor.

3. The proximity switch as recited in claim 2, wherein said at least one sensor additionally comprises a blocking diode having a polarity and being coupled to connected in series to the input of said at least one sensor for transmitting back a positive or negative potential to the input of said amplifier depending upon the polarity of said blocking diode.

4. The proximity switch as recited in claim 3, wherein said first magnetic field sensor includes an oscillator circuit coupled to its input for sensing the magnetic field, and wherein said feedback signal from said at least one second sensor is coupled to said oscillator circuit for maintaining the input signal of said first field sensor constant until the interference field is diminished.

5. The proximity switch as recited in claim 4, wherein said oscillator circuit is an HF oscillator adapted to be deattenuated by a magnetic field in proximity to said first field sensor.

6. The proximity switch as recited in claim 5, wherein said at least one second magnetic field sensor comprises an HF oscillator adapted to be deattenuated by the close proximity of a magnetic interference field.

7. The proximity switch as recited in claim 6, additionally comprising additional interference field sensors coupled in parallel to said at least one second magnetic field sensor, said magnetic field sensors comprising reed contact switches.

8. The proximity switch as recited in claim 7, wherein said additional interference field sensors are positioned so that outside interference fields are within the range of said additional interference field sensors.

9. The proximity switch as recited in claim 1, wherein said second magnetic field sensors for sensing the interference field have a higher response sensitivity and lower switching delay than said first magnetic field sensor.

10. The proximity switch as recited in claim 9, wherein said first and second magnetic field sensors are combined in a common housing.

11. The proximity switch as recited in claim 10, additionally comprising a magnetic screen disposed between said first and second magnetic sensors within said housing.

12. The proximity switch as recited in claim 7, wherein said additional interference field sensors have a higher response sensitivity and lower switching delay than said first magnetic field sensor.

13. The proximity switch as recited in claim 12, wherein said plurality of interference field sensors and said first magnetic field sensor are combined in a common housing.

14. The proximity switch as recited in claim 13, additionally comprising magnetic screens disposed between said first magnetic sensor and said additional magnetic interference field sensors.

15. The proximity switch as recited in claim 1, wherein said amplifier additionally comprises a signal delay circuit disposed between the output of said amplifier and said switch means for delaying the response of said first magnetic field sensor.

\* \* \* \* \*